US011134601B2

(12) United States Patent
Ushii et al.

(10) Patent No.: US 11,134,601 B2
(45) Date of Patent: Sep. 28, 2021

(54) SYSTEM FOR MANAGING COMPONENT MOUNTING LINE

(71) Applicant: FUJI CORPORATION, Chiryu (JP)

(72) Inventors: Satoshi Ushii, Nagoya (JP); Shigeto Oyama, Kariya (JP)

(73) Assignee: FUJI CORPORATION, Chiryu (JP)

( * ) Notice: Subject to any disclaimer, the term of this patent is extended or adjusted under 35 U.S.C. 154(b) by 168 days.

(21) Appl. No.: 16/471,803

(22) PCT Filed: Jan. 5, 2017

(86) PCT No.: PCT/JP2017/000158
§ 371 (c)(1),
(2) Date: Jun. 20, 2019

(87) PCT Pub. No.: WO2018/127956
PCT Pub. Date: Jul. 12, 2018

(65) Prior Publication Data
US 2020/0100410 A1 Mar. 26, 2020

(51) Int. Cl.
*H05K 13/08* (2006.01)
*H05K 13/04* (2006.01)

(52) U.S. Cl.
CPC ..... *H05K 13/0895* (2018.08); *H05K 13/0409* (2018.08); *H05K 13/0419* (2018.08); *H05K 13/086* (2018.08); *H05K 13/0882* (2018.08)

(58) Field of Classification Search
CPC ........... H05K 13/0409; H05K 13/0419; H05K 13/086; H05K 13/0882; H05K 13/0895
See application file for complete search history.

(56) References Cited

U.S. PATENT DOCUMENTS

| 6,640,431 | B1 * | 11/2003 | Yoriki | ............... | H05K 13/0409 |
| | | | | | 29/834 |
| 7,966,718 | B2 * | 6/2011 | Kodama | ............ | H05K 13/0404 |
| | | | | | 29/739 |

(Continued)

FOREIGN PATENT DOCUMENTS

| EP | 1 796 453 A1 | 6/2007 |
| EP | 2 874 480 A1 | 5/2015 |

(Continued)

OTHER PUBLICATIONS

Extended European Search Report dated Nov. 25, 2019 in Patent Application No. 17889807.8, 10 pages.

(Continued)

*Primary Examiner* — Carl J Arbes
(74) *Attorney, Agent, or Firm* — Oblon, McClelland, Maier & Neustadt, L.L.P.

(57) ABSTRACT

A system including: an automatic exchanging device configured to move along the multiple component mounters arranged in a line and automatically exchange automatically exchangeable units of the component mounters; an operation monitoring device configured to monitor an operation state of the automatically exchangeable units of the component mounters and monitor whether it is necessary to exchange the automatically exchangeable units due to maintenance or a breakdown; and a management device configured to, when the operation monitoring device determines that exchange of one of the automatically exchangeable units of the component mounters is necessary due to maintenance or a breakdown, move the automatic exchanging device to the component mounter in question and cause the automatic exchanging device to perform automatic exchange of the automatically exchangeable unit of the component mounter with an exchange-use unit.

10 Claims, 6 Drawing Sheets

(56) References Cited

U.S. PATENT DOCUMENTS

| | | | |
|---|---|---|---|
| 9,055,708 B2 * | 6/2015 | Kodama | H05K 3/305 |
| 9,963,303 B2 * | 5/2018 | Mizuno | H05K 13/0409 |
| 10,362,719 B2 * | 7/2019 | Iisaka | H05K 13/0408 |
| 2008/0147232 A1 | 6/2008 | Kuribayashi et al. | |
| 2016/0212896 A1 | 7/2016 | Iisaka et al. | |
| 2017/0156243 A1 | 6/2017 | Iisaka et al. | |

FOREIGN PATENT DOCUMENTS

| | | |
|---|---|---|
| EP | 2 874 481 A1 | 5/2015 |
| EP | 3 046 403 A1 | 7/2016 |
| JP | 2002-190700 A | 7/2002 |
| JP | 2004-172500 A * | 6/2004 |
| JP | 4887347 B * | 4/2009 |
| JP | 2009-302329 A | 12/2009 |
| JP | 2010-98213 A | 4/2010 |
| WO | WO 2014/010084 A1 | 1/2014 |
| WO | WO 2015/15124 A1 | 10/2015 |
| WO | WO 2016/199237 A1 | 12/2016 |

OTHER PUBLICATIONS

International Search Report dated Mar. 14, 2017 in PCT/JP2017/000158 filed Jan. 5, 2017.

* cited by examiner

SYSTEM FOR MANAGING COMPONENT MOUNTING LINE

TECHNICAL FIELD

The present disclosure is related to a system for managing a component mounting line configured from multiple component mounters.

BACKGROUND ART

Conventionally, a component mounting line includes multiple component mounters arranged in a line along a conveyance path of a circuit board, and at each component mounter components supplied from feeders are picked up by suction nozzles and mounted on a circuit board in order to produce a component-mounted board. During production, if a feeder of the component mounter breaks, or a suction nozzle is damaged or blocked, an error such as a component pickup error occurs, and when the error is detected, operation of the component mounter stops, an operator performs work to exchange the feeder or suction nozzle, then operation of the component mounter is restarted. Also, because breakdowns are more likely to occur the longer the usage period of the feeders and suction nozzles, to prevent such a breakdown, it is necessary to periodically exchange feeders and suction nozzles and perform maintenance.

With respect to this, with a component mounter of patent literature 1 (JP-A-2002-190700), monitoring is performed as to whether maintenance is required by calculating a component pickup rate, mounting rate, component pickup position deviation amount, component mounting position deviation amount, and the like for each feeder and suction nozzle during production, and if maintenance is required for any of the feeders or suction nozzles, that feeder or suction nozzle is displayed on a display section, production is stopped, and an operator performs maintenance on the feeder or suction nozzle.

CITATION LIST

Patent Literature

Patent literature 1: JP-A-2002-190700

BRIEF SUMMARY

Technical Problem

However, when a feeder or suction nozzle for which maintenance is required is displayed on the display section, it is necessary for an operator to quickly and manually perform the work of removing the feeder or suction nozzle from the component mounter, attaching an exchange-use feeder or suction nozzle, and restarting production, which is troublesome work. Further, if the operator is performing other work when a feeder or suction nozzle for which maintenance is required is displayed on the display section, the feeder or suction nozzle for which maintenance is required will not be switched out immediately, and the production stoppage time will be lengthened, thereby worsening the operating rate (productivity).

Solution to Problem

To solve the above problems, disclosed herein is a system for managing a component mounting line configured from multiple component mounters arranged in a line along a conveyance path of a circuit board, the component mounters producing a component-mounted board by mounting component on the circuit board, the system including: an automatic exchanging device configured to move along the multiple component mounters arranged in a line and automatically exchange automatically exchangeable units of the component mounters; an operation monitoring device configured to monitor an operation state of the automatically exchangeable units of the component mounters and monitor whether it is necessary to exchange the automatically exchangeable units due to maintenance or a breakdown; and a management device configured to, when the operation monitoring device determines that exchange of one of the automatically exchangeable units of the component mounters is necessary due to maintenance or a breakdown, move the automatic exchanging device to the component mounter in question and cause the automatic exchanging device to perform automatic exchange of the automatically exchangeable unit of the component mounter with an exchange-use unit.

With this configuration, the operation monitoring device monitors an operation state of the automatically exchangeable units of the component mounters and monitors whether it is necessary to exchange the automatically exchangeable units due to maintenance or a breakdown, and upon determining that exchange of one of the automatically exchangeable units of the component mounters is necessary due to maintenance or a breakdown, a management device moves the automatic exchanging device to the component mounter in question and causes the automatic exchanging device to perform automatic exchange of the automatically exchangeable unit of the component mounter with an exchange-use unit; therefore, when exchange of one of the automatically exchangeable units of the component mounters is necessary due to maintenance or a breakdown, an operator does not have to perform work of exchanging the automatically exchangeable unit of the component mounter, thereby reducing the workload of the operator. Further, when exchange of one of the automatically exchangeable units of the component mounters is necessary due to maintenance or a breakdown, it is possible to perform automatic exchange of the automatically exchangeable unit quickly using the automatic exchanging device, so production can be restarted quickly, which prevents a worsening of the operating rate (productivity).

Here, the automatically exchangeable unit may be, for example, any of a feeder configured to supply components, a suction nozzle configured to pick up the component, a chuck configured to grasp the component, or a mounting head configured to hold the suction nozzle or the chuck.

Also, the component mounting line may be provided with a storage compartment configured to store exchange-use units to be exchanged with the automatically exchangeable units of the multiple component mounters, and the automatic exchanging device may be configured to, in accordance with an instruction from the management device, receive the exchange-use unit from the storage compartment, move to the component mounter at which automatic exchange is to be performed, automatically exchange the automatically exchangeable unit of the component mounter with the exchange-use unit, and load the collected automatically exchangeable unit in the storage compartment. Accordingly, it is possible to efficiently perform switching of an exchange-use unit and an exchanged unit between the storage compartment and each component mounter, and to efficiently perform collection of exchanged units removed from each component mounter.

In this case, replenishment of exchange-use units to the storage compartment and collection of exchanged units from the storage compartment may be performed manually by an operator, but this work may also be reduced. Specifically, further provided may be a unit transport device configured to move to and from a work location at which an operator performs work and the storage compartment, wherein, at the work location, an operator may load the exchange-use unit on the unit transport device, the unit transport device may move to the storage compartment, load the exchange-use unit into the storage compartment, load the exchanged automatically exchangeable unit collected in the storage compartment on the unit transport device, and return to the work location. Accordingly, at the work location that is away from the storage compartment, it is possible for an operator to efficiently perform replenishment of exchange-use units, and maintenance or repair of exchanged units that have been collected.

Further, the work location and the unit transport device may be shared between multiple component mounting lines. Accordingly, it is possible for the same operator to perform replenishment of exchange-use units to storage compartments of multiple component mounting lines and maintenance and repair of exchanged units collected from multiple component mounting lines at the same work location, it is not necessary to provide a work location or unit transport device at each component mounting line, which allows the multiple component mounting lines to be more compact in a factory, and the quantity of operators allocated to manage the multiple component mounting lines is reduced, further saving resources.

With the present disclosure, it is possible to collectively monitor the operation states of automatically exchangeable units of multiple component mounters using an external operation monitoring device, but it is easier to perform monitoring of operation states of each of the automatically exchangeable units of the component mounters by providing an operation monitoring device on each of the component mounters. Further, the operation monitoring device may be configured to monitor at least one of a tape feeding time of a feeder that is the automatically exchangeable unit of the component mounter, a flow amount or a nozzle length of a suction nozzle that is the automatically exchangeable unit of the component mounter, or an axis movement time or valve operation time of a mounting head that is the automatically exchangeable unit of the component mounter, and to monitor whether it is necessary to exchange the automatically exchangeable units due to maintenance or a breakdown based on whether a specified value of the at least one of the tape feeding time, the flow amount, the nozzle length, the axis movement time, or the valve operation time exceeds a specified threshold.

Further, the operation monitoring device may be provided with a determination criteria changing section configured to allow an operator to change a determination criteria used to determine whether it is necessary to exchange the automatically exchangeable unit due to maintenance or a breakdown. Accordingly, for example, if an operator thinks that the quantity of exchanges due to maintenance is too high, they can change the determination criteria to reduce the exchange quantity due to maintenance, or if the operator thinks that the quantity of exchanges due to breakdowns is too high, they can change the determination criteria to increase the exchange quantity due to maintenance. Accordingly, the operator can change the determination criteria to reduce both the exchange quantity due to maintenance and the exchange quantity due to breakdowns.

Further, the operation monitoring device may be configured to send, in advance, to the management device, information related to the automatically exchangeable unit for a case in which it was possible to predict a timing at which exchange of the automatically exchangeable unit of the component mounter is required due to maintenance or a breakdown, and the management device may be configured to, when the information related to the exchange of the automatically exchangeable unit of the component mounter is received in advance from the operation monitoring device, as preparation for exchange of the automatically exchangeable unit, move the automatic exchanging device to or near to the component mounter. Accordingly, it is possible to perform exchange of the automatically exchangeable units of the component mounters in a short time, reducing the production stoppage time due to exchange, thereby improving the operating rate (productivity).

Further, each component mounter may be provided with a stock section configured to temporarily accommodate the exchange-use unit and the collected automatically exchangeable unit that has been exchanged, and the management device may be configured to, as preparation for exchange of the automatically exchangeable unit of each component mounter, use a period in which the automatic exchanging device is not going to perform automatic exchange of the automatically exchangeable unit to move the automatic exchanging device to each of the component mounters, accommodate the exchange-use unit in the stock section, and collect the automatically exchangeable unit that has been exchanged from the stock section. In this manner too, it is possible to efficiently perform exchange of automatically exchangeable units of each component mounter.

DESCRIPTION OF EMBODIMENTS

An embodiment is described below. First, the configuration of component mounting line 10 will be described with reference to FIGS. 1 to 6. Component mounting line 10 is configured from multiple component mounters 12 lined up in a row along a conveyance direction (X direction) of circuit board 11, with a solder printer (not shown) for printing solder on circuit board 11, storage compartment 19 for storing cassette-type feeders 14 (refer to FIG. 4) and suction nozzle exchanging device 81 (refer to FIGS. 5 and 6), and the like being provided on the board loading side of component mounting line 10. In the present embodiment, cassette-type feeders 14 and cassette-type suction nozzle exchanging unit 81 are automatically exchangeable units.

Figure 2:
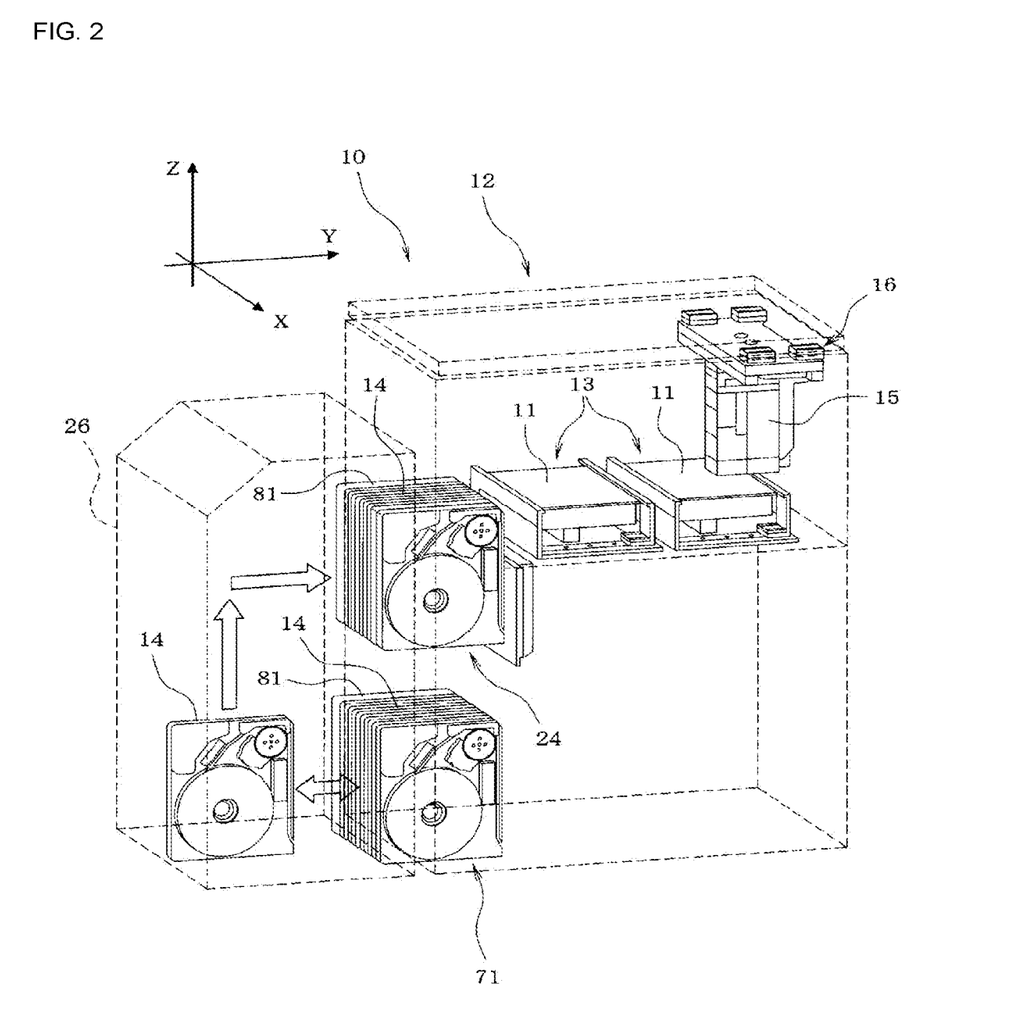
FIG. 2 is a perspective view schematically showing the configuration of the automatic exchanging device and a component mounter.

As shown in FIG. 2, each component mounter 12 is provided with items such as two conveyors 13 that convey circuit board 11, mounting head 15 that holds a suction nozzle (not shown) that picks up a component supplied from cassette-type feeder 14 and mounts the component on circuit board 11, head moving device 16 that moves head 15 in the XY directions (left-right and front-rear directions), and display device 23 such as a liquid crystal display or a CRT.

In each of the component mounters 12 of component mounting line 10, circuit board 11 conveyed from an upstream component mounter 12 is conveyed to a specified position by conveyor 13, the circuit board 11 is clamped in position by a clamp mechanism (not illustrated), a component supplied from cassette-type feeder 14 is picked by the suction nozzle of mounting head 15, moved from the pickup position to an imaging position, and imaged from below by a component imaging camera (not shown) to determine a pickup position deviation amount and the like, thereafter, the pickup position deviation amount is corrected and the component is mounted on the circuit board 11 on conveyor 13 to produce a component-mounted board.

Figure 4:
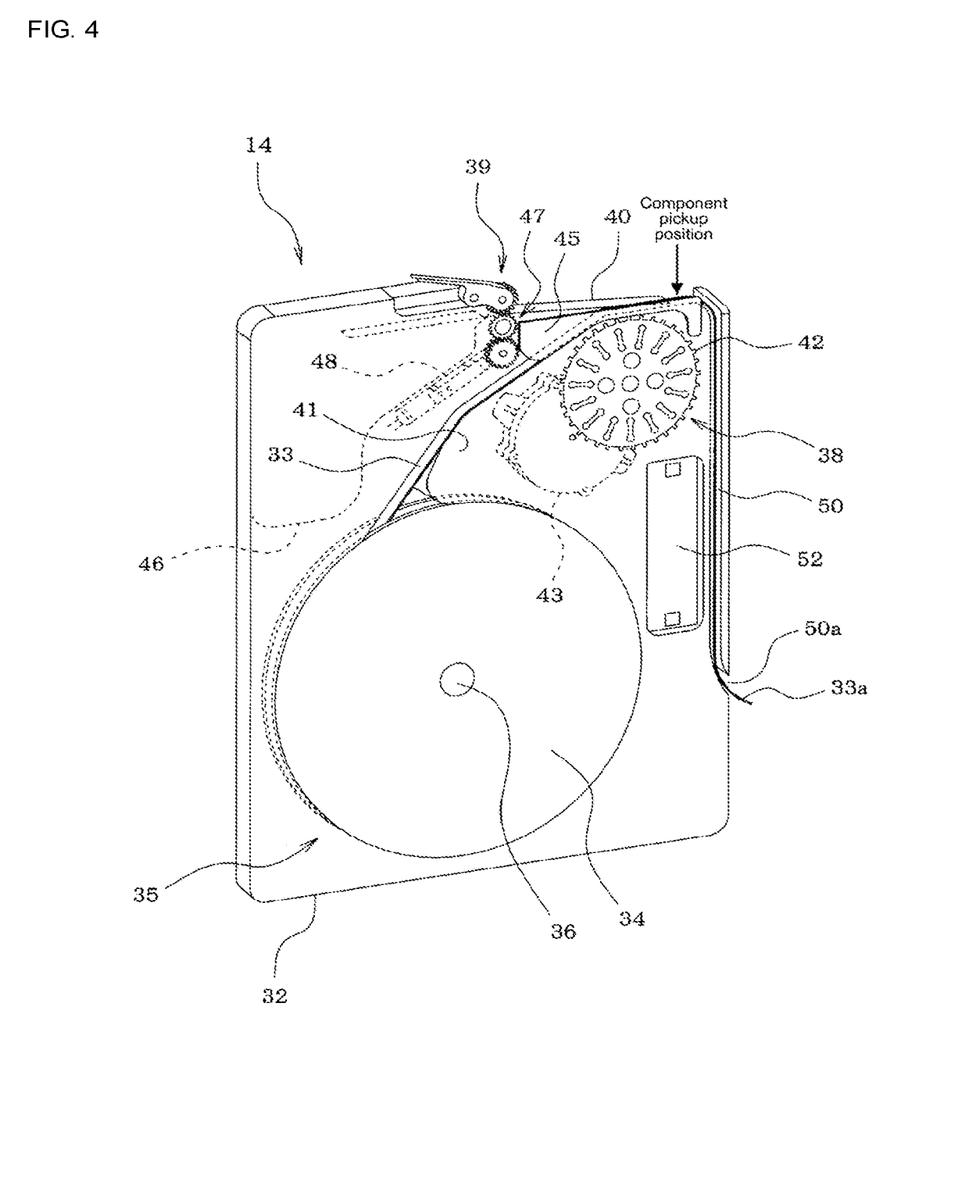
FIG. 4 is a perspective view showing a cassette-type feeder.

Next, the configuration of cassette-type feeder 14 is described with reference to FIG. 4. Cassette case 32 of cassette-type feeder 14 is formed from transparent or non-transparent plastic or metal plates or the like, and a side section (cover) thereof can be opened and closed. Tape loading section 35, in which tape reel 34 around which component supply tape 33 is wound is loaded in a detachable (exchangeable) manner, is provided inside the cassette case 32. Reel holding shaft 36 that holds tape reel 34 in a rotatable manner is provided in the center of tape loading section 35.

Tape feeding mechanism 38 that feeds component supply tape 33 pulled out from tape reel 34 to a component pickup position, and top film peeling mechanism 39 that peels top film 40 (also known as cover tape) from component supply tape 33 before the component pickup position to expose components in component supply tape 33 are provided inside cassette case 32.

Tape feeding mechanism 38 is formed from sprocket 42 that is provided in the vicinity below the component pickup position, motor 43 that drives sprocket 42 to rotate, and the like, and tape feeding mechanism 38 pitch feeds component supply tape 33 to the component pickup position by engaging the teeth of sprocket 42 with tape feeding holes, which are formed in the edge of one side of component supply tape 33 at a predetermined pitch, and rotating sprocket 42.

Top film peeling mechanism 39 is formed from tape retainer 45 for retaining component supply tape 33 and peeling top film 40 from the top surface of component supply tape 73 before the component pickup position, top film feeding gear mechanism 47 that pulls top film 40 that is peeled by tape retainer 45 in the opposite direction from the tape feeding direction to feed top film 40 into top film collection section 46, which is provided on the top portion of cassette case 32, motor 48 that drives top film feeding gear mechanism 47, and the like.

Waste tape disposal path 50 that guides waste tape 33*a* (in the first embodiment, only the carrier tape from which top film 40 has been peeled), which has passed the component pickup position and from which the components have been removed, downward to dispose of waste tape 33*a* is provided extending downwards at the end section of the tape feeding direction side within cassette case 32, and outlet 50*a* of waste tape disposal path 50 is provided in a position closer to the bottom side than the center of the end surface of the tape feeding direction side of cassette case 32.

Control device 52 that controls motor 43 of tape feeding mechanism 38 and motor 48 of top film peeling mechanism 39 are provided within cassette case 32. In addition, while not shown in the drawings, a connector for communication and power that is connected to the connector for communication and power of component mounter 12 is provided in cassette case 32.

Figure 5:
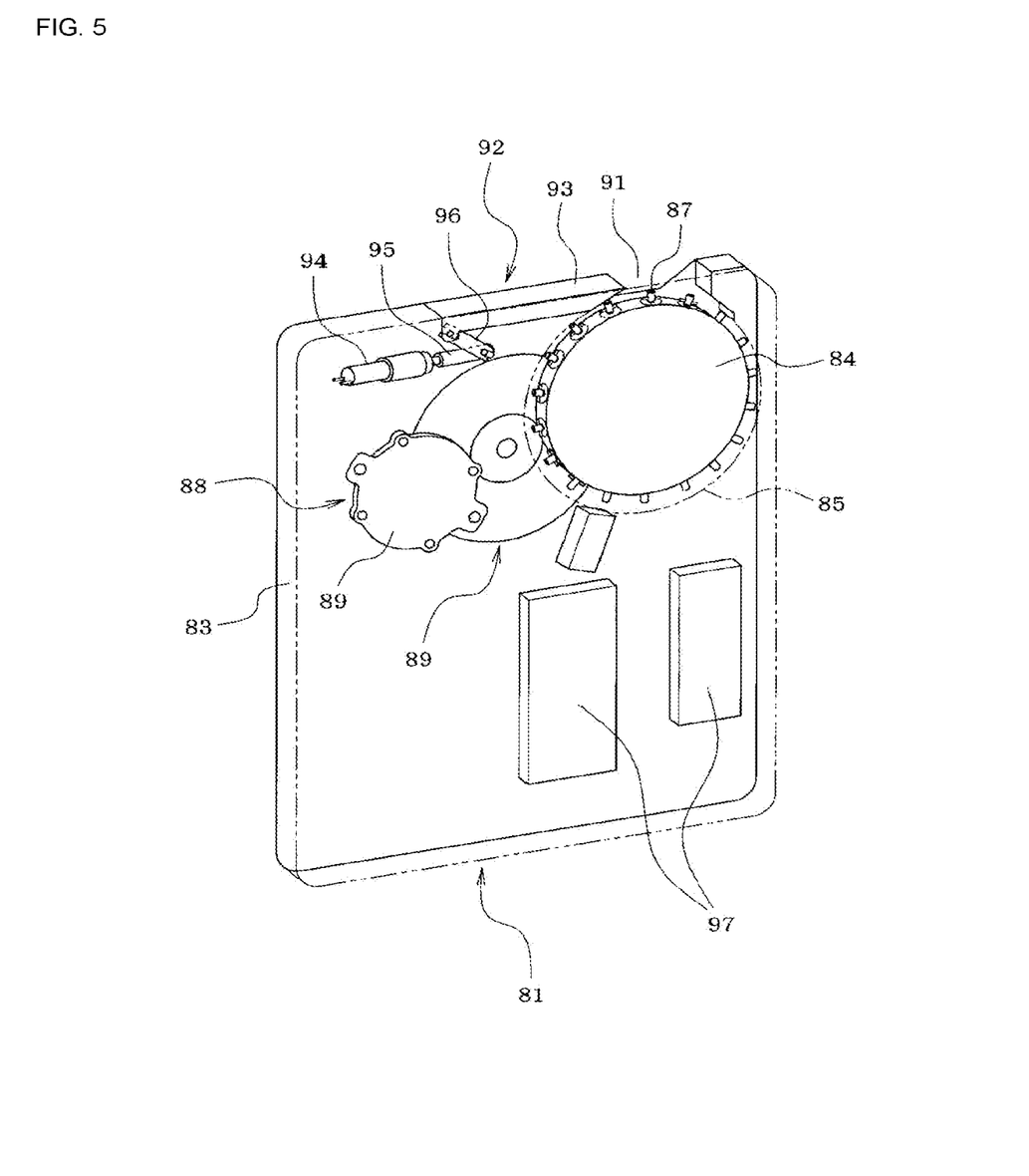
FIG. 5 is a perspective view showing a cassette-type suction nozzle exchanging unit.
Figure 6:
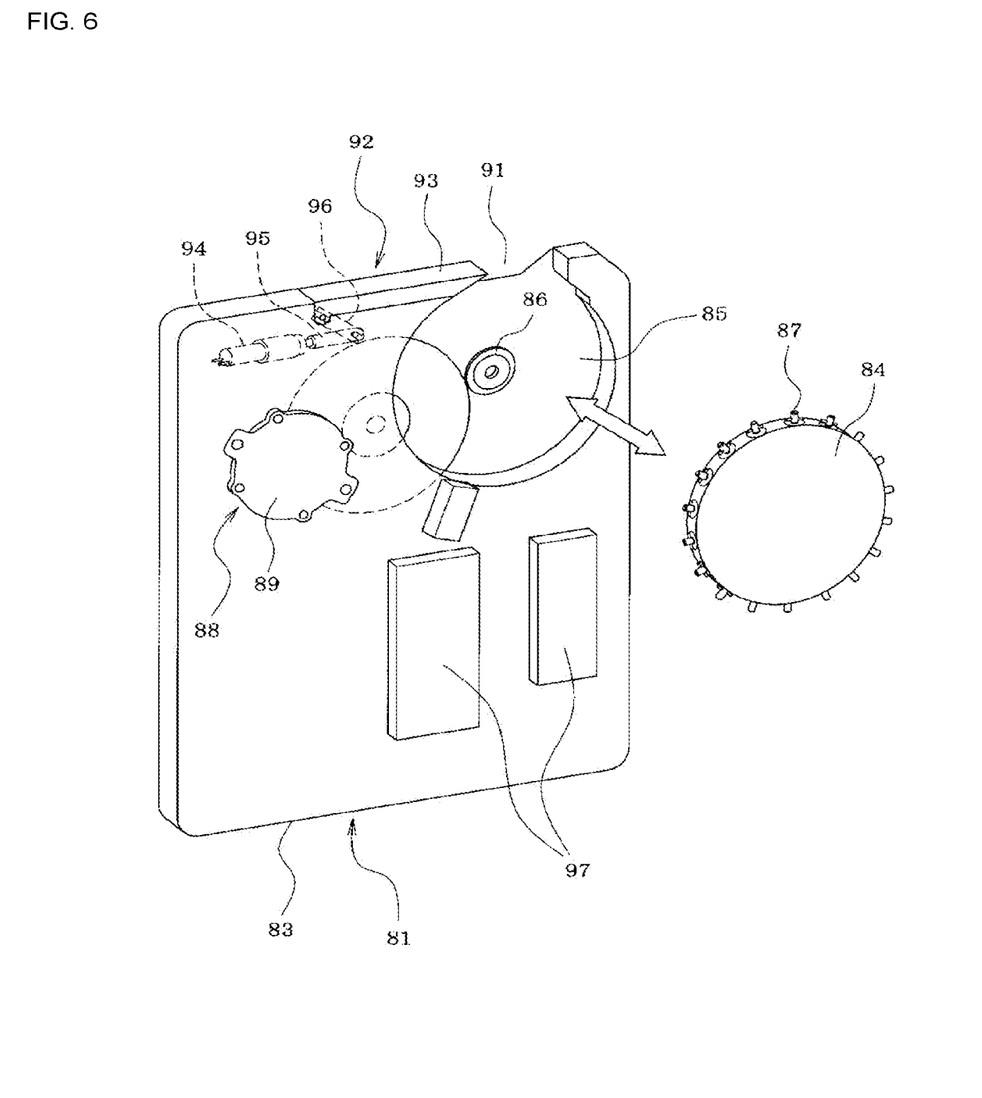
FIG. 6 is a perspective view showing a state with a rotation-type nozzle station removed from the cassette-type suction nozzle exchanging unit.

Next, the configuration of cassette-type suction nozzle exchanging unit 81 will be described with reference to FIGS. 5 and 6. Cassette case 83 of cassette-type suction nozzle exchanging unit 81 is formed of a transparent or non-transparent plastic plate, a metal plate, or the like, and the side surface section (cover) is capable of opening and closing. A circular recessed nozzle station loading section 85 in which disc-shaped revolving nozzle station 84 is detachably (exchangeably) loaded is provided inside cassette case 83, drive shaft 86 (refer to FIG. 6) is provided facing horizontally in the center of nozzle station loading section 85, and the center section of revolving nozzle station 84 is detachably connected to drive shaft 86 such that transfer of rotation is possible. On the outer circumferential section of revolving nozzle station 84, multiple suction nozzles 87 for exchanging with a suction nozzle of mounting head 15 of component mounter 12 are arranged radially at a specified pitch, and revolving nozzle station 84 is configured to hold the multiple suction nozzles in a detachable manner.

Further, revolving drive device 88 that makes revolving nozzle station 84 revolve is provided inside cassette case 83. Revolving drive device 88 is formed from motor 89 that serves as a drive source, and gear mechanism 90 that transmits the rotation of motor 89 to drive shaft 86.

Nozzle exchange port 91 is formed in a position corresponding to the topmost end (in a direction straight up from the center of revolving nozzle station 84) of revolving nozzle station 84 within the top surface of cassette case 83, and nozzle exchange is performed between revolving nozzle station 84 and mounting head 15 of component mounter 12 through nozzle exchange port 91. Shutter mechanism 92 that opens and closes nozzle exchange port 91 is provided in cassette case 83. Shutter mechanism 92 is configured from shutter plate 93 that slides along nozzle exchange port 91, motor 94 as a drive source, feeding gear 95 that converts rotation of motor 94 into linear motion, and link member 96 that connects feeding gear 95 and shutter plate 93.

When mounting head 15 of component mounter 12 is caused to hold a suction nozzle 87 inside the cassette-type suction nozzle exchanging unit 81 that is set in feeder setting section 24 of component mounter 12, mounting head 15 is moved above nozzle exchange port 91 of suction nozzle exchanging unit 81, and shutter plate 93 of shutter mechanism 92 is subjected to an opening operation to open nozzle exchange port 91. After the revolving nozzle station 84 within suction nozzle exchanging unit 81 is rotated as appropriate such that the suction nozzle 87 to be exchanged this time is positioned in nozzle exchange port 91, a nozzle holder (not shown) of mounting head 15 is lowered, the suction nozzle 87 is held by the nozzle holder of mounting head 15 through nozzle exchange port 91, then the nozzle holder of mounting head 15 is lifted and the suction nozzle 87 is removed from revolving nozzle station 84.

Note that, a configuration may be adopted in which, when returning the suction nozzle that is held on the nozzle holder of mounting head 15 to a vacant slot in revolving nozzle station 84 within the suction nozzle exchanging unit 81, after rotating the revolving nozzle station 84 as appropriate and positioning the vacant slot of revolving nozzle station 84 at nozzle exchange port 33, the nozzle holder of mounting head 15 is lowered and the suction nozzle held by the nozzle holder of mounting head 15 may be returned to the empty slot of revolving nozzle station 84.

Control device 97 that controls motor 89 of revolving drive device 88 and motor 94 of shutter mechanism 92 is provided inside cassette case 83. In addition, while not shown in the drawings, a connector for communication and power that is connected to the connector for communication and power of component mounter 12 is provided in cassette case 83.

Figure 1:
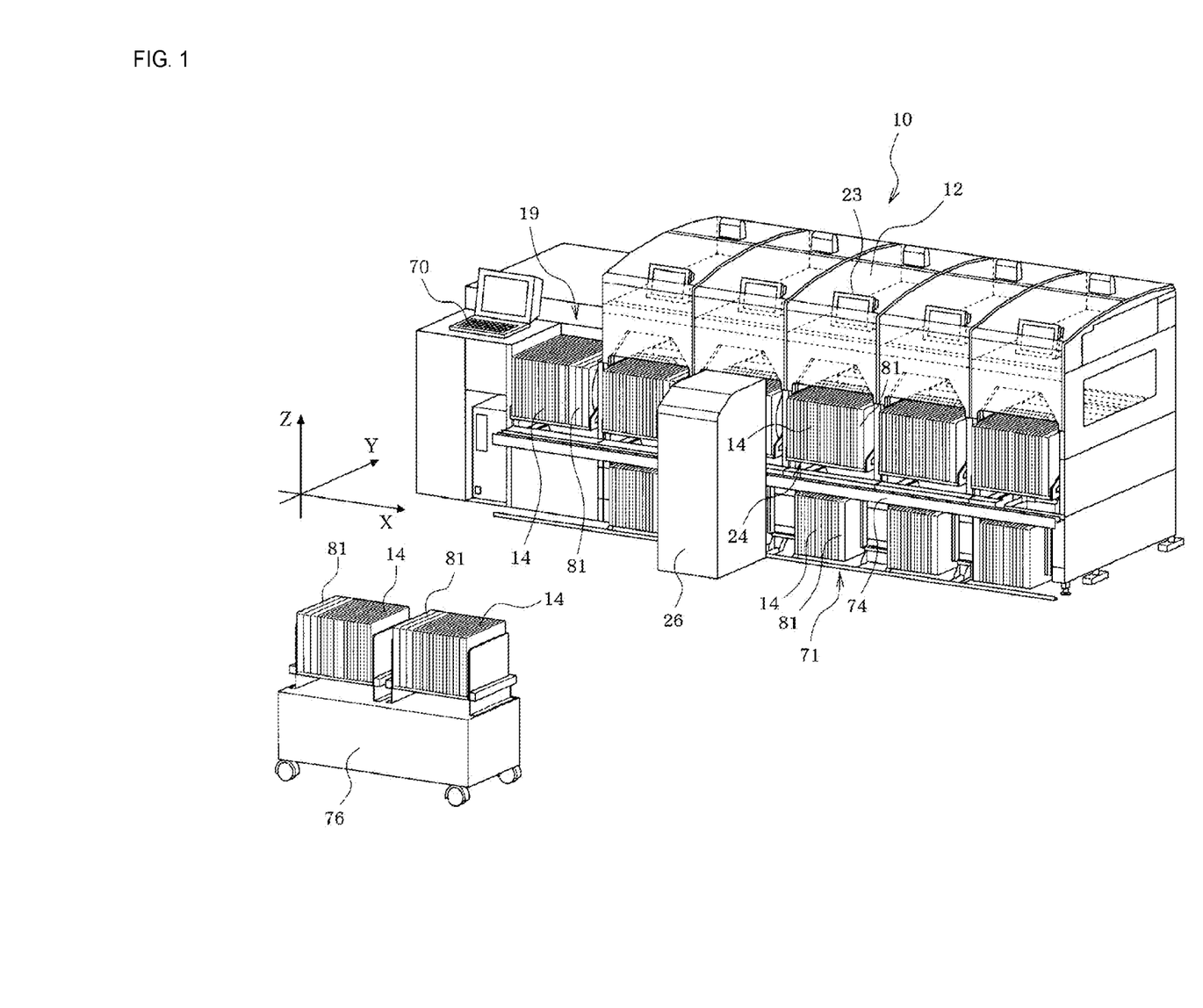
FIG. 1 is a perspective view of the overall configuration of a component mounting line, which is an embodiment of the present disclosure.

As shown in FIG. 1, automatic exchanging device 26 that performs setting and removing of cassette-type feeders 14 to and from feeder setting section 24 of each component 12 is provided on the front side of component mounting line 10. Automatic exchanging device 26 also performs setting and removing of cassette-type suction nozzle exchanging unit 81 to and from feeder setting section of each component mounter 12.

Stock section 71 for temporarily stocking exchange-use multiple feeders 14 and suction nozzle exchanging units 81 to be set on feeder setting section 24 is provided below feeder setting section 24 of each component mounter 12. Automatic exchanging device 26 removes feeders 14 and suction nozzle exchanging units 81 that are exchange targets from feeder setting section 24 of the component mounters 12 and collects them in stock section 71, and removes feeders 14 and suction nozzle exchanging units 81 specified in the production job (production program) from stock section 71 and sets the feeders 14 and suction nozzle exchanging units 81 in the feeder setting section 24 of the component mounters 12. Here, in a case in which there are no exchange-use feeders 14 or suction nozzle exchanging units 81 housed in stock section 71 of component mounter 12, as described later, automatic exchanging device 26 receives an exchange-use feeder 14 or suction nozzle exchanging unit 81 from storage compartment 19, moves to the component mounter 12, and automatically exchanges the exchange-use feeder 14 or suction nozzle exchanging unit 81.

Guide rail 74 for moving automatic exchanging device 26 in the left-right direction (X direction) along the row of component mounters 12 is provided on the front side of component mounting line 10 so as to extend in the X direction along the entire length of component mounting line 10, and automatic exchanging device 26 moves between storage compartment 19 at the furthest upstream end of component mounting line 10 and the furthest downstream component mounter 12. Automatic exchanging device 26 removes a feeder 14 or suction nozzle exchanging unit 81 specified in the production job from storage compartment 19, transports it to stock section 71 of the specified component mounter 12, and removes a used feeder 14 or suction nozzle exchanging unit 81 from stock section 71 and collects it in storage compartment 19.

Figure 3:
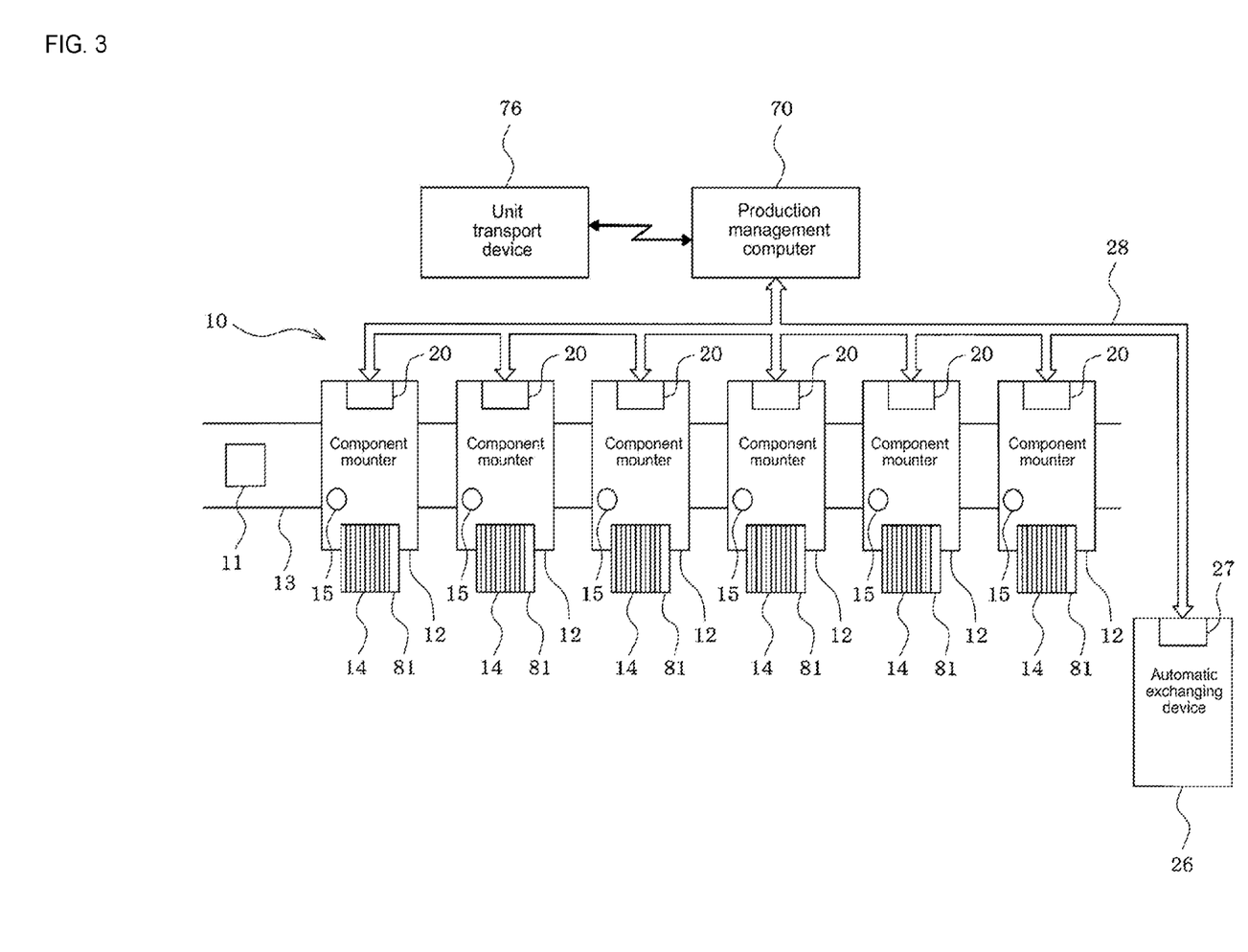
FIG. 3 is a block diagram schematically showing the configuration of a management system of the component mounting line equipped with an automatic exchanging device.

As shown in FIG. 3, control device 27 of automatic exchanging device 26 and control device 20 of each component mounter 12 of component mounting line 10 are connected via network 28 such as a wired LAN or wireless LAN to production management computer 70 (management device) that manages overall production of component mounting line 10, and operation of automatic exchanging device 26 and operation of each component mounter 12 of component mounting line 10 are managed by management computer 70.

Further, component mounting line 10 of the present embodiment is further provided with unit transport device 76 (refer to FIG. 1) configured to autonomously move to and from a work location at which an operator performs work and storage compartment 19, wherein, at the work location, an operator may load exchange-use feeder 14 or suction nozzle exchanging unit 81 on unit transport device 76, unit transport device 76 may move to storage compartment 19, load the exchange-use feeder 14 or suction nozzle exchanging unit 81 into storage compartment 19, load the exchanged feeder 14 or suction nozzle exchanging unit 81 collected in storage compartment 19 on unit transport device 76, and return to the work location. Note that, loaded on unit transport device 76 is a unit switching mechanism (not shown) configured to load and unload feeder 14 and suction nozzle exchanging unit 81 to and from storage compartment 19.

Production management computer 70 communicates with unit transport device 76 via a wireless LAN or the like and manages operation of the unit transport device 76. In the present embodiment, a work location at which an operator performs work and unit transport device 76 are shared between multiple component mounting lines 10.

Control device 20 of each component mounter 12 also functions as an operation monitoring device configured to monitor an operation state of feeders 14 and suction nozzle exchanging units 81 that are automatically exchangeable units of the component mounters 12, and monitor whether it is necessary to exchange the automatically exchangeable units due to maintenance or a breakdown. In descriptions below, an "automatically exchangeable unit" may mean either of "feeder 14" or "suction nozzle exchanging unit 81".

Specifically, control device 20 of each component mounter 12 monitors a tape feeding time of feeder 14 that is an automatically exchangeable unit, a flow amount or a nozzle length of a suction nozzle that is an automatically exchangeable unit, or an axis movement time or valve operation time of mounting head 15 that is an automatically exchangeable unit, and monitors whether it is necessary to exchange the automatically exchangeable units due to maintenance or a breakdown based on whether a specified value of the at least one of the tape feeding time, the flow amount, the nozzle length, the axis movement time, or the valve operation time exceeds a specified threshold. Alternatively, from the operation state of the automatically exchangeable unit, monitoring may be performed of at least one of the occurrence of a breakdown, total operation time, operation quantity, error occurrence rate (for example, occurrence rate of component pickup error, or occurrence rate of suction nozzle exchange errors due to operation errors with suction nozzle exchanging unit 81), or the error occurrence quantity, so as to monitor whether it is necessary to exchange the automatically exchangeable unit due to maintenance or a breakdown. For example, at a point when the total operation time, operation quantity, error occurrence rate, and error occurrence quantity each exceeds a specified threshold (determination criteria), it may be determined that exchange of the automatically exchangeable unit is required, and that information may be sent to production management computer 70. Accordingly, production management computer 70 is able to move automatic exchanging device 26 to the component mounter 12 for which unit exchange is required, and to cause automatic exchanging device 26 to automatically exchange the automatically exchangeable unit of the component mounter 12.

Further, in the present embodiment, control device 20 of each component mounter 12 is provided with a determination criteria changing section (not shown) configured to allow an operator to change a determination criteria used to determine whether it is necessary to exchange the automatically exchangeable unit due to maintenance or a breakdown. Accordingly, for example, if an operator thinks that the quantity of exchanges due to maintenance is too high, they can change the determination criteria to reduce the exchange quantity due to maintenance, or if the operator thinks that the quantity of exchanges due to breakdowns is too high, they can change the determination criteria to increase the exchange quantity due to maintenance. Accordingly, the operator can change the determination criteria to reduce both the exchange quantity due to maintenance and the exchange quantity due to breakdowns. Note that, the determination criteria changing section may be configured using an input operation device (not shown) such as a keyboard, a mouse, or touchscreen panel connected to control device 20 of component mounter 12.

Also, control device 20 of each component mounter 12, in a case in which the timing at which exchange of the automatically exchangeable unit due to maintenance or a breakdown is required is predicted, sends information related to the exchange of the automatically exchangeable unit to production management computer 70 in advance. Then, production management computer 70, when the information related to the automatically exchangeable unit of the component mounter 12 is received from control device 20 of component mounter 12 in advance, as preparation for exchange of the automatically exchangeable unit, causes automatic exchanging device 26 to move to or near to the component mounter 12 and stand by. Accordingly, it is possible to perform exchange of the automatically exchangeable units of the component mounters in a short time, reducing the production stoppage time due to exchange, thereby improving the operating rate (productivity).

Further, production management computer 70, as preparation for exchange of the automatically exchangeable unit of each component mounter 12, using a period in which automatic exchanging device 26 is not going to perform automatic exchange of the automatically exchangeable unit, causes automatic exchanging device 26 to move to each of the component mounters 12, accommodate the exchange-use unit in stock section 71, and collect the automatically exchangeable unit that has been exchanged from stock section 71. In this manner, too, it is possible to efficiently perform exchange of automatically exchangeable units of each component mounter 12.

According to an embodiment described above, control device 20 of each component mounter 12 monitors an operation state of the automatically exchangeable units and monitors whether it is necessary to exchange the automatically exchangeable units due to maintenance or a breakdown, and upon determining that exchange of one of the automatically exchangeable units of the component mounters 12 is necessary due to maintenance or a breakdown, production management computer 70 moves automatic exchanging device 26 to the component mounter 12 in question and causes automatic exchanging device 26 to perform automatic exchange of the automatically exchangeable unit of the component mounter 12 with an exchange-use unit; therefore, when exchange of one of the automatically exchangeable units of the component mounters 12 is necessary due to maintenance or a breakdown, an operator does not have to perform work of exchanging the automatically exchangeable unit of the component mounter 12, thereby reducing the workload of the operator. Further, when exchange of one of the automatically exchangeable units of the component mounters 12 is necessary due to maintenance or a breakdown, it is possible to perform automatic exchange of the automatically exchangeable unit quickly using automatic exchanging device 26, so production can be restarted quickly, which prevents a worsening of the operating rate (productivity).

Further, component mounting line 10 is provided with storage compartment 19 configured to store exchange-use units to be exchanged with the automatically exchangeable units of the multiple component mounters 12, and automatic exchanging device 26 is configured to, in accordance with an instruction from production management computer 70, receive the exchange-use unit from the storage compartment 19, move to the component mounter 12 at which automatic exchange is to be performed, automatically exchange the automatically exchangeable unit of the component mounter 12 with the exchange-use unit, and load the collected automatically exchangeable unit in the storage compartment 19; therefore, it is possible to efficiently perform switching of an exchange-use unit and an exchanged unit between the storage compartment 19 and each component mounter 12, and to efficiently perform collection of exchanged units removed from each component mounter 12.

Further, also provided is unit transport device 76 configured to move to and from a work location at which an operator performs work and storage compartment 19, wherein, at the work location, an operator loads the exchange-use unit on unit transport device 76, the unit transport device 76 moves to the storage compartment 19, loads the exchange-use unit into the storage compartment 19, loads the exchanged automatically exchangeable unit collected in the storage compartment 19 on the unit transport device 76, and returns to the work location; therefore, at the work location that is away from storage compartment 19, it is possible for an operator to efficiently perform replenishment of exchange-use units, and maintenance or repair of exchanged units that have been collected. However, unit transport device 76 is not essential, and replenishment of exchange-use units to storage compartment 19 and collection of exchanged units from storage compartment 19 may be performed manually by an operator.

Also, in the present embodiment, because the work location and unit transport device 76 are shared between multiple component mounting lines 10, it is possible for the same operator to perform replenishment of exchange-use units to storage compartments 19 of multiple component mounting lines 10 and maintenance and repair of exchanged units collected from multiple component mounting lines 10 at the same work location, and it is not necessary to provide a work location or unit transport device 76 at each component mounting line 10, which allows the multiple component mounting lines 10 to be more compact in a factory, and the quantity of operators allocated to manage the multiple component mounting lines 10 can be reduced, further saving resources. However, it is also possible to provide a separate work location and unit transport device 76 for each component mounting line 10.

Note that, with the present embodiment, control device 20 of each component mounter 12 is configured to function as the operation monitoring device that monitors the operation state of the automatically exchangeable units and monitors whether it is necessary to exchange the automatically exchangeable unit due to maintenance or a breakdown, however, it is possible to collectively monitor the operation states of automatically exchangeable units of multiple component mounters 12 using an external computer such as production management computer 70 as an operation monitoring device.

Also, automatically exchangeable units of each component mounter 12 are not limited to feeders 14 and suction nozzle exchanging units 81, for example, they may be mounting head 15 in a case in which mounting head 15 is held on component mounter 12 so as to be automatically exchangeable, or a chuck that grasps a component in a case in which the chuck is held on mounting head 15 to be exchangeable with a suction nozzle.

Otherwise, the present disclosure is not limited to the above embodiments, and it goes without saying that various changes and modifications can be made without departing from the gist, such as the configuration of automatic exchanging device 26 or unit transport device 76, the configuration of feeder 14 or suction nozzle exchanging unit 81, and the like may be changed.

REFERENCE SIGNS LIST

10: component mounting line;
11: circuit board;
12: component mounter;
14: cassette-type feeder;
15: mounting head;
16: head moving device;
19: storage compartment;
20: control device of component mounter (operation monitoring device);
24: feeder setting section;
26: automatic exchanging device;
70: production management computer (management device);
71: stock section;
76: unit transport device;
81: cassette-type suction nozzle exchanging unit;
87: suction nozzle

The invention claimed is:

1. A system for managing a component mounting line configured from multiple component mounters arranged in a line along a conveyance path of a circuit board, the component mounters producing a component-mounted board by mounting a component on the circuit board, the system comprising:
an automatic exchanging device configured to move along a guide rail on an exterior of the multiple component mounters arranged in a line and automatically exchange automatically exchangeable units of the component mounters;
an operation monitoring device configured to monitor an operation state of the automatically exchangeable units of the component mounters and monitor whether it is necessary to exchange the automatically exchangeable units due to maintenance or a breakdown; and
a management device configured to, when the operation monitoring device determines that exchange of one of the automatically exchangeable units of the component mounters is necessary due to maintenance or a breakdown, move the automatic exchanging device along the guide rail to a component mounter of the component mounters and cause the automatic exchanging device to perform automatic exchange of the one of the automatically exchangeable units of the component mounter with an exchange-use unit.

2. The system for managing the component mounting line according to claim 1, wherein
the automatically exchangeable unit is any of a feeder configured to supply the component, a suction nozzle configured to pick up the component, a chuck configured to grasp the component, or a mounting head configured to hold the suction nozzle or the chuck.

3. The system for managing the component mounting line according to claim 1, wherein
the component mounting line is provided with a storage compartment configured to store exchange-use units to be exchanged with the automatically exchangeable units of the multiple component mounters, and
the automatic exchanging device is configured to, in accordance with an instruction from the management device, receive the exchange-use unit from the storage compartment, move to the component mounter at which automatic exchange is to be performed, automatically exchange the automatically exchangeable unit of the component mounter with the exchange-use unit, and load the collected automatically exchangeable unit in the storage compartment.

4. The system for managing component mounting line according to claim 3, further comprising
a unit transport device configured to move to and from a work location at which an operator performs work and the storage compartment, wherein
at the work location, an operator loads the exchange-use unit on the unit transport device, the unit transport device moves to the storage compartment, loads the exchange-use unit into the storage compartment, loads the exchanged automatically exchangeable unit collected in the storage compartment on the unit transport device, and returns to the work location.

5. The system for managing the component mounting line according to claim 4, wherein
the work location and the unit transport device are shared between multiple component mounting lines.

6. The system for managing the component mounting line according to claim 1, wherein
the operation monitoring device is provided on each the component mounters, and
the operation monitoring device is configured to monitor at least one of a tape feeding time of a feeder that is the automatically exchangeable unit of the component mounter, a flow amount or a nozzle length of a suction nozzle that is the automatically exchangeable unit of the component mounter, or an axis movement time or valve operation time of a mounting head that is the automatically exchangeable unit of the component mounter, and to monitor whether it is necessary to exchange the automatically exchangeable units due to maintenance or a breakdown based on whether a specified value of the at least one of the tape feeding time, the flow amount, the nozzle length, the axis movement time, or the valve operation time exceeds a specified threshold.

7. The system for managing the component mounting line according to claim 1, wherein
the operation monitoring device is provided with a determination criteria changing section configured to allow an operator to change a determination criteria used to determine whether it is necessary to exchange the automatically exchangeable unit due to maintenance or a breakdown.

8. The system for managing the component mounting line according to claim 1, wherein
the operation monitoring device is configured to send, in advance, to the management device, information related to the automatically exchangeable unit for a case in which it was possible to predict a timing at which exchange of the automatically exchangeable unit of the component mounter is required due to maintenance or a breakdown, and the management device is configured to, when the information related to the exchange of the automatically exchangeable unit of the component mounter is received in advance from the operation monitoring device, as preparation for exchange of the automatically exchangeable unit, move the automatic exchanging device to or near to the component mounter.

9. The system for managing the component mounting line according to claim 1, wherein each component mounter is provided with a stock section configured to temporarily accommodate the exchange-use unit and the collected automatically exchangeable unit that has been exchanged, and the management device is configured to, as preparation for exchange of the automatically exchangeable unit of each component mounter, use a period in which the automatic exchanging device is not going to perform automatic exchange of the automatically exchangeable unit to move the automatic exchanging device to each of the component mounters, accommodate the exchange-use unit in the stock section, and collect the automatically exchangeable unit that has been exchanged from the stock section.

10. The system for managing the component mounting line according to claim 1, wherein the one of the automatically exchangeable units is a suction nozzle exchanging unit including a revolving nozzle station.

* * * * *